US011205924B2

United States Patent
Das et al.

(10) Patent No.: US 11,205,924 B2
(45) Date of Patent: Dec. 21, 2021

(54) LOAD DISTRIBUTION FOR A HYBRID UPS SYSTEM

(71) Applicant: SCHNEIDER ELECTRIC IT CORPORATION, Foxboro, MA (US)

(72) Inventors: Rana Das, Karnataka (IN); Ankit Kherodiya, Karnataka (IN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/159,835

(22) Filed: Jan. 27, 2021

(65) Prior Publication Data
US 2021/0234397 A1 Jul. 29, 2021

(30) Foreign Application Priority Data
Jan. 28, 2020 (IN) .............................. 202011003781

(51) Int. Cl.
*H02J 9/06* (2006.01)
*H02J 3/38* (2006.01)
*H02J 7/00* (2006.01)
*G01R 19/25* (2006.01)
*H02J 7/35* (2006.01)

(52) U.S. Cl.
CPC .......... *H02J 9/062* (2013.01); *G01R 19/2513* (2013.01); *H02J 3/381* (2013.01); *H02J 7/007* (2013.01); *H02J 7/0048* (2020.01); *H02J 7/35* (2013.01); *H02J 2300/26* (2020.01)

(58) Field of Classification Search
CPC .......... H02J 9/062; H02J 7/0048; H02J 3/381; H02J 7/007; H02J 2300/26; H02J 9/06; H02J 3/38; H02J 7/00; G01R 19/2513; G01R 19/25
See application file for complete search history.

(56) References Cited

U.S. PATENT DOCUMENTS

2008/0217998 A1  9/2008  Parmley
2008/0278003 A1  11/2008  Pouchet et al.
2011/0278931 A1  11/2011  Johnson, Jr.

OTHER PUBLICATIONS

Brochure, Luminous, Solar NXT PCU, 3 pages, retreived Jan. 27, 2021.
Web Page, Buy Solar Solutions and Solar Products Online at Best Price in India / Luminous India, 23 pages, https://www.luminousindia.com/solar-products.html [retreived on Jan. 27, 2021].

*Primary Examiner* — Robert L Deberadinis
(74) *Attorney, Agent, or Firm* — Lando & Anastasi, LLP

(57) ABSTRACT

Embodiments herein provide a UPS system comprising an input, a converter configured to convert input AC power into DC power, a DC bus configured to receive DC power from the converter, an inverter configured to convert DC power from the DC bus into output AC power, a Maximum Power Point Tracking (MPPT) controller configured to receive DC power from a power source and to identify a maximum power point of the power source, a DC-DC converter configured to regulate DC power provided from the MPPT controller to the DC bus, and a controller configured to determine whether the maximum power point of the power source is greater than or equal to at least one threshold level, and in response to determining that the maximum power point is greater than or equal to the at least one threshold level, operate the DC-DC converter to draw DC power from the MPPT controller at the maximum power point of the power source.

20 Claims, 2 Drawing Sheets

LOAD DISTRIBUTION FOR A HYBRID UPS SYSTEM

CROSS-REFERENCE TO RELATED APPLICATION

This application claims the benefit under 35 U.S.C. § 119 of Indian Patent Application No. 202011003781 filed on Jan. 28, 2020 which is hereby incorporated herein by reference in its entirety for all purposes.

BACKGROUND

1. Field of Invention

The present disclosure relates generally to uninterruptible power supplies (UPS).

2. Discussion of Related Art

The use of power devices, such as uninterruptible power supplies (UPS), to provide regulated, uninterrupted power for sensitive and/or critical loads, such as computer systems and other data processing systems, is known. Known uninterruptible power supplies include on-line UPS's, off-line UPS's, line interactive UPS's as well as others. On-line UPS's provide conditioned AC power as well as back-up AC power upon interruption of a primary source of AC power. Off-line UPS's typically do not provide conditioning of input AC power, but do provide back-up AC power upon interruption of the primary AC power source. Line interactive UPS's are similar to off-line UPS's in that they switch to battery power when a blackout occurs but also typically include a multi-tap transformer for regulating the output voltage provided by the UPS.

SUMMARY

At least one aspect of the invention is directed to an Uninterruptible Power Supply (UPS) system, the UPS system comprising an input configured to be coupled to an AC source and to receive input AC power from the AC source, an output configured to provide output AC power to a load, a converter coupled to the input and configured to convert the input AC power into DC power, a DC bus coupled to the converter and configured to receive DC power from the converter, an inverter coupled to the DC bus and configured to convert DC power from the DC bus into the output AC power and provide the output AC power to the output, a Maximum Power Point Tracking (MPPT) controller configured to be coupled to a power source, to receive DC power from the power source, and to identify a maximum power point of the power source, a DC-DC converter coupled to the MPPT controller and the DC bus and configured to regulate DC power provided from the MPPT controller to the DC bus, and a controller coupled to the MPPT controller and the DC-DC converter, the controller configured to monitor the maximum power point of the power source, determine whether the maximum power point is greater than or equal to at least one threshold level, and in response to determining that the maximum power point is greater than or equal to the at least one threshold level, operate the DC-DC converter to draw DC power from the MPPT controller at the maximum power point of the power source.

In one embodiment, when operating the DC-DC converter to draw DC power from the MPPT controller at the maximum power point of the power source, the controller is configured to reference a look-up table with respect to the maximum power point to identify a corresponding duty-cycle and to operate the DC-DC converter at the corresponding duty-cycle. In some embodiments, when operating the DC-DC converter to draw DC power from the MPPT controller at the maximum power point of the power source, the controller is configured to operate the DC-DC converter such that substantially all of the power drawn from the MPPT controller is provided to the DC bus.

In various embodiments, the UPS system includes a battery interface coupled to the DC-DC converter and configured to be coupled to a battery and to receive backup DC power from the battery. In one embodiment, the controller is configured to operate the converter to provide DC power, derived from the input AC power, to the DC bus. In some embodiments, the controller is configured to operate the converter to provide DC power to the DC bus while the maximum power point is less than a first threshold indicating the DC power drawn from the MPPT controller is not sufficient to charge the battery. In various embodiments, the controller is further configured to operate the converter to provide DC power to the DC-DC converter to charge the battery.

In one embodiment, the controller is configured to operate the converter to provide DC power to the DC bus in response to a determination that the battery is fully charged while the maximum power point is greater than the first threshold and less than a second threshold indicating the DC power drawn from the MPPT controller is not sufficient to power the load. In some embodiments, the controller is configured to operate the converter to provide DC power to the DC bus in response to a determination that the battery is at least partially uncharged while the maximum power point is greater than the first threshold and less than a third threshold indicating the DC power drawn from the MPPT controller is not sufficient to charge the battery and power the load.

In various embodiments, controller is configured to operate the DC-DC converter to provide DC power, derived from the backup DC power, to the DC bus. In one embodiment, the controller is configured to operate the DC-DC converter to provide DC power to the DC bus in response to a determination that the input AC power is not acceptable while the maximum power point is less than a first threshold indicating the DC power drawn from the MPPT controller is not sufficient to charge the battery. In some embodiments, the controller is configured to operate the DC-DC converter to provide DC power to the DC bus in response to a determination that the input AC power is unacceptable and the battery is fully charged while the maximum power point is greater than or equal to the first threshold and less than a second threshold indicating the DC power drawn from the MPPT controller is not sufficient to power the load.

Another aspect of the invention is directed to a non-transitory computer readable medium storing thereon sequences of computer-executable instructions for operating a UPS having an input configured to be coupled to an AC source, an output configured to provide output AC power to a load, a converter coupled to the input, a DC bus coupled to the converter, and an inverter coupled to the DC bus. The sequences of computer-executable instructions include instructions that instruct at least one processor to operate the UPS to receive DC power from a power source, receive a maximum power point of the power source, regulate power provided from the power source to the DC bus, determine whether the maximum power point of the power source is greater than at least one threshold level, draw DC power from the power source at the maximum power point of the power source in response to a determination that the maximum power point of the power source is greater than or equal to the at least one threshold level, and convert DC power from the DC bus into the output AC power.

In one embodiment, the UPS further has a DC-DC converter, and wherein the sequences of instructions include instructions that cause the at least one processor to operate the UPS to draw the DC power from the power source at the maximum power point of the power source by referencing a look-up table with respect to the maximum power point to identify a corresponding duty-cycle and operating the DC-DC converter at the corresponding duty-cycle. In various embodiments, the sequences of instructions include instructions that cause the at least one processor to operate the UPS to draw DC power from the power source at the maximum power point of the power source by providing substantially all of the power drawn from the power source to the DC bus.

In various embodiments, the sequences of instructions include instructions that cause the at least one processor to operate the UPS to operate the converter to provide DC power, derived from the input AC power, to the DC bus. In some embodiments, the UPS further has a battery interface coupled to the DC-DC converter and configured to be coupled to a battery and to receive backup DC power from the battery and the sequences of instructions include instructions that cause the at least one processor to operate the UPS to provide, with the converter, DC power to the DC bus while the maximum power point is less than a first threshold indicating the DC power drawn from the power source is not sufficient to charge the battery.

In some embodiments, the sequences of instructions include instructions that cause the at least one processor to operate the UPS to provide, with the converter, DC power to the DC-DC converter to charge the battery. In one embodiment, the sequences of instructions include instructions that cause the at least one processor to operate the UPS to provide, with the converter, DC power to the DC bus in response to a determination that the battery is fully charged while the maximum power point is greater than the first threshold and less than a second threshold indicating the DC power drawn from the power source is not sufficient to power the load. In various embodiments, the sequences of instructions include instructions that cause the at least one processor to operate the UPS to provide, with the converter, DC power to the DC bus in response to a determination that the battery is at least partially uncharged while the maximum power point is greater than the first threshold and less than a third threshold indicating the DC power drawn from the power source is not sufficient to charge the battery and power the load.

In one embodiment, the sequences of instructions include instructions that cause the at least one processor to operate the UPS to operate the DC-DC converter to provide DC power, derived from the backup DC power, to the DC bus. In various embodiments, the sequences of instructions include instructions that cause the at least one processor to operate the UPS to provide, with the DC-DC converter, DC power to the DC bus in response to a determination that the input AC power is not acceptable while the maximum power point is less than a first threshold indicating the DC power drawn from the power source is not sufficient to charge the battery. In some embodiments, the sequences of instructions include instructions that cause the at least one processor to operate the UPS to provide, with the DC-DC converter, DC power to the DC bus in response to a determination that the input AC power is unacceptable and the battery is fully charged while the maximum power point is greater than or equal to the first threshold and less than a second threshold indicating the DC power drawn from the power source is not sufficient to power the load.

Another aspect of the invention is directed an Uninterruptible Power Supply (UPS) system, the UPS system comprising an input configured to be coupled to an AC source and to receive input AC power from the AC source, an output configured to provide output AC power to a load, a converter coupled to the input and configured to convert the input AC power into DC power, a DC bus coupled to the converter and configured to receive DC power from the converter, an inverter coupled to the DC bus and configured to convert DC power from the DC bus into the output AC power and provide the output AC power to the output, and means for identifying a maximum power point of a power source coupled to the UPS system, for drawing DC power from the power source at the maximum power point, and for providing the DC power drawn from the power source at the maximum power point to the DC bus.

In one embodiment, the UPS includes means for providing power, derived from the input AC power, to the DC bus to supplement the DC power drawn from the power source at the maximum power point. In some embodiments, the UPS includes means for providing backup DC power from a battery to the DC bus.

Another aspect of the invention is directed to a method for operating a UPS having an input configured to be coupled to an AC source, an output configured to provide output AC power to a load, a converter coupled to the input, a DC bus coupled to the converter, and an inverter coupled to the DC bus. The method includes receiving DC power from a power source, identifying a maximum power point of the power source, regulating power provided from the power source to the DC bus, determining whether the maximum power point of the power source is greater than at least one threshold level, in response to determining that the maximum power point of the power source is greater than or equal to the at least one threshold level, drawing DC power from the power source at the maximum power point of the power source, and converting DC power from the DC bus into the output AC power.

In one embodiment, the UPS includes a DC-DC converter and drawing the DC power from the power source at the maximum power point of the power source includes referencing a look-up table with respect to the maximum power point to identify a corresponding duty-cycle and operating the DC-DC converter at the corresponding duty-cycle. In some embodiments, drawing DC power from the power source at the maximum power point of the power source includes providing substantially all of the power drawn from the power source to the DC bus.

In various embodiments, wherein the UPS further includes a battery interface coupled to the DC-DC converter and configured to be coupled to a battery and to receive backup DC power from the battery. In some embodiments, the method includes operating the converter to provide DC power, derived from the input AC power, to the DC bus. In one embodiment, the method includes providing, with the converter, DC power to the DC bus while the maximum power point is less than a first threshold indicating the DC power drawn from the MPPT controller is not sufficient to charge the battery.

In some embodiments, the method includes providing, with the converter, DC power to the DC-DC converter to charge the battery. In one embodiment, the method includes providing, with the converter, DC power to the DC bus in response to a determination that the battery is fully charged while the maximum power point is greater than the first threshold and less than a second threshold indicating the DC power drawn from the MPPT controller is not sufficient to power the load. In various embodiments, the method includes providing, with the converter, DC power to the DC bus in response to a determination that the battery is at least partially uncharged while the maximum power point is greater than the first threshold and less than a third threshold indicating the DC power drawn from the MPPT controller is not sufficient to charge the battery and power the load.

In one embodiment, the method includes operating the DC-DC converter to provide DC power, derived from the backup DC power, to the DC bus. In some embodiments, the method includes providing, with the DC-DC converter, DC power to the DC bus in response to a determination that the input AC power is not acceptable while the maximum power point is less than a first threshold indicating the DC power drawn from the MPPT controller is not sufficient to charge the battery. In various embodiments, the method includes providing, with the DC-DC converter, DC power to the DC bus in response to a determination that the input AC power is unacceptable and the battery is at least partially uncharged while the maximum power point is greater than or equal to the first threshold and less than a second threshold indicating the DC power drawn from the MPPT controller is not sufficient to power the load.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
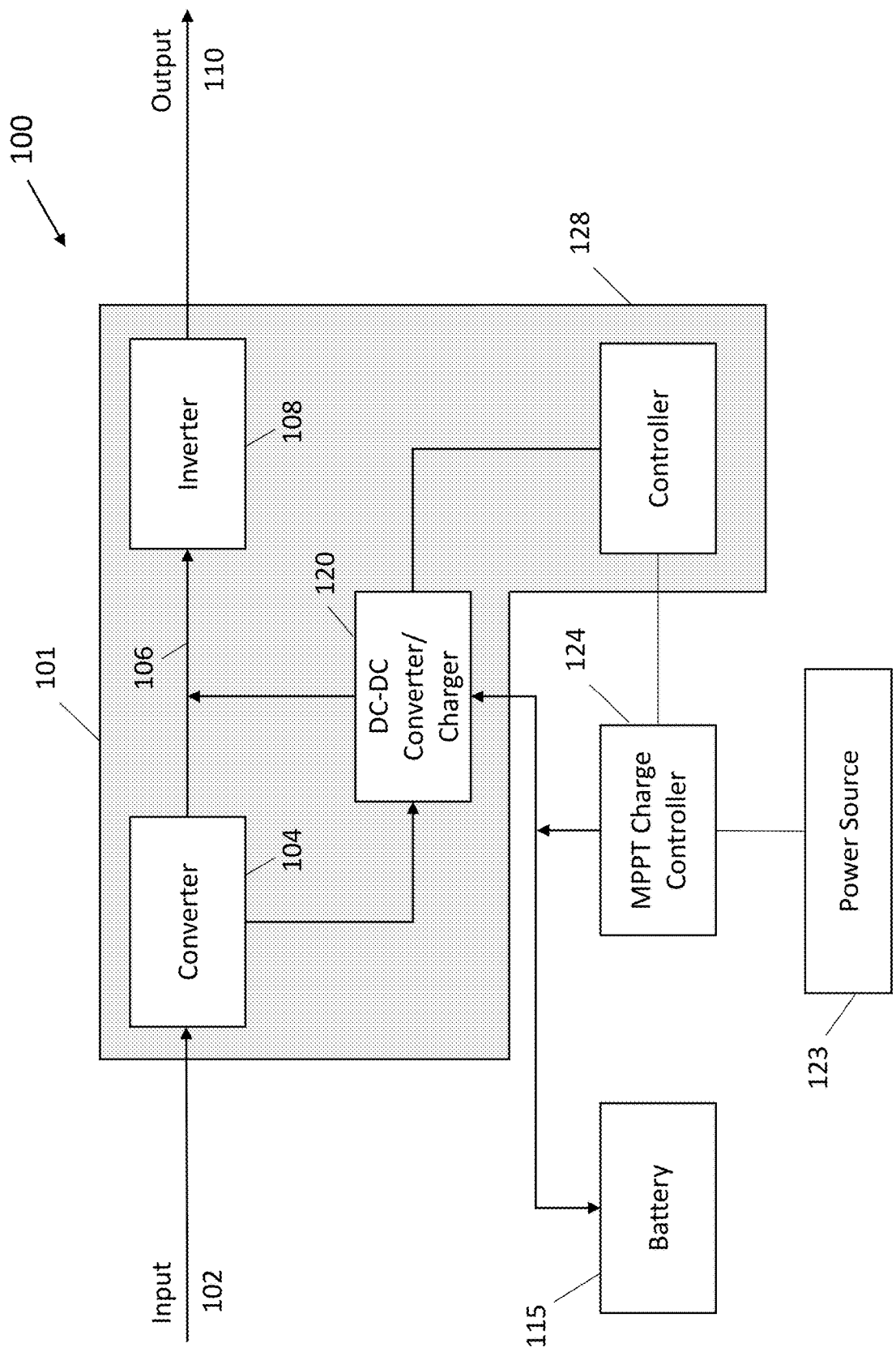
FIG. 1 is a schematic diagram of a UPS according to aspects described herein.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, power devices, such as uninterruptible power supplies (UPS), are oftentimes used to provide regulated, uninterrupted power to sensitive and/or critical loads. A conventional online UPS rectifies input AC power provided by an electric utility using a Power Factor Correction circuit (PFC) to provide DC power to at least one DC bus. The rectified DC power on the DC buses is typically used to charge a battery while mains power is available. In the absence of mains power, the battery discharges and provides DC power to the DC buses. From the DC power on the DC buses, an inverter generates an AC output voltage that is provided to a load. Since the DC bus is powered either by mains or the battery, the output power of the UPS is uninterrupted if the mains fails and the battery is sufficiently charged. Typical online UPS's may also operate in a bypass mode where unconditioned power with basic protection is provided directly from an AC power source to a load via a bypass line.

In remote locations having limited utility (i.e., grid) availability, the coupling of a UPS to a second backup power source (e.g., a renewable power source such as a photovoltaic array) in addition to a battery may be desired to avoid depletion of the battery and improve availability of the UPS during grid downtime. However, in such a system, the output variability of the renewable energy source can potentially pose efficiency and reliability issues in a UPS. A UPS system is described herein that optimizes throughput from a renewable energy backup source to the UPS.

FIG. 1 is a block diagram of power supply system 100 according to one aspect of the present invention. The power supply system 100 includes a UPS 101, a battery 115, a renewable power source 123, and a Maximum Power Point Tracking (MPPT) charge controller 124. In one example, the UPS 101 includes a mains input 102, a converter 104, a DC bus 106, an inverter 108, an output 110, a DC-DC converter 120, and a controller 128. In some examples, the battery 115 may be included in the UPS 101. The mains input 102 is coupled to the converter 104 and the output 110 is coupled to the inverter 108. The DC bus 106 is coupled between the converter 104 and the inverter 108. In one example, the mains input 102 may be coupled to the converter 104 via an input filter and backfeed circuit and the converter 108 may be coupled to the output 110 via an inverter relay. In some examples, the UPS 101 may also include a bypass line having a bypass relay. In some examples, the bypass relay may be controlled to selectively couple the input filter and backfeed circuit (i.e., the mains input 102) to the inverter relay (i.e., the output 110) via the bypass line.

The battery 115 is coupled to the DC-DC converter 120. In some examples, the battery 115 may be coupled to a battery filter and fuse circuit via a battery interface and the battery filter and fuse circuit may be coupled to the DC-DC converter 120. In some examples, the DC-DC converter 120 may be configured to charge the battery 115. In other examples, the DC-DC converter 120 may include separate charging circuitry to charge the battery 115. The renewable power source 123 is coupled to the MPPT charge controller 124. In one example, the renewable power source 123 may be coupled to the MPPT charge controller 124 via a renewable source interface. The MPPT charge controller 124 is coupled to the DC-DC converter 120. The DC-DC converter 120 is also coupled to the converter 104 and the DC bus 106. The controller 128 is coupled to the MPPT charge controller 124. According to one embodiment, the MPPT charge controller 124 is an SCC-MPPT 3KW controller manufactured by Voltronic Power Inc. of Taipei, Taiwan, R.O.C.; however, in other embodiments, a different type of MPPT charge controller can be utilized. In some embodiments, the controller 128 is coupled to the MPPT charge controller 124 via an RS-232 or RS-485 compatible connection; however, in other embodiments, a different type of connection may be utilized. The controller 128 is also coupled to at least the mains input 102, the output 110, the converter 104, the DC bus 106, the DC-DC converter 120, and the inverter 108. The mains input 102 is configured to be coupled to an AC mains power source (e.g., an AC grid) to receive an input voltage level.

The controller 128 communicates with the MPPT charge controller 124 to monitor the renewable power source 123 and is configured to operate the UPS 101 in different modes of operation based on a state of the renewable power source 123. In some examples, the controller 128 may operate the UPS 101 in different modes of operation based on a maximum power point of the renewable power source 123.

In a renewable mode of operation, DC power derived from the renewable power source 123 can be provided to the DC-DC converter 120. The DC-DC converter 120 converts the DC power derived from the renewable power source 123 into regulated DC power and provides the regulated DC power to the DC bus 106. In an online mode of operation, AC power from the mains input 102 can be provided to the converter 104 via the input filter and backfeed circuit 103 and provided as DC power to the DC bus 106. In some examples, in a hybrid-online mode of operation, DC power derived from the renewable power source 123 and the mains input 102 may be provided to the DC bus 106. According to one embodiment, the converter 104 is a Power Factor Correction (PFC) converter 104; however, in other embodiments, other types of converters may be utilized. The controller 128 operates the converter 104 to convert the AC power into DC power and provide the DC power to the DC bus 106.

In some examples, DC power from the DC bus 106 (derived from DC power provided by the renewable power source 123 and/or the AC power provided by the AC source 103) is provided to the inverter 108. The controller 128 operates the inverter 108 to convert the DC power into regulated AC power and provide the regulated AC power to a load coupled to the output 110. The controller may also operate the inverter relay 109 to close, coupling the output 110 to the output of the inverter 108, and operates the bypass relay 114 to open, decoupling the bypass line 112 from the inverter relay 109. Operation of the UPS 101 by the controller 128 to provide AC power to the output 110 derived from at least one of the DC power from the renewable power source 123 and the AC power provided by the AC source 103 is discussed in greater detail below.

When DC power derived from the renewable power source 123 is not acceptable (i.e., insufficient to power a load coupled to the output 110) and AC power provided to the mains input 102 is not acceptable (i.e., below an input power threshold), the controller 128 can operate the UPS 101 in a backup mode of operation. In the backup mode of operation, DC power from the battery 115 can be provided to the DC-DC converter 120. The DC-DC converter 120 regulates the DC power received from the battery 115 and provides the regulated DC power to the DC bus 106. The inverter 108 receives the DC power from the DC bus 106, and the controller 128 operates the inverter 108 to convert the DC power from the DC bus 106 into regulated AC power and provides the regulated AC power to the output 110. In some examples, in a hybrid-backup mode of operation, DC power derived from the battery 115 and the renewable power source 123 may be provided to the DC bus 106.

Figure 2:
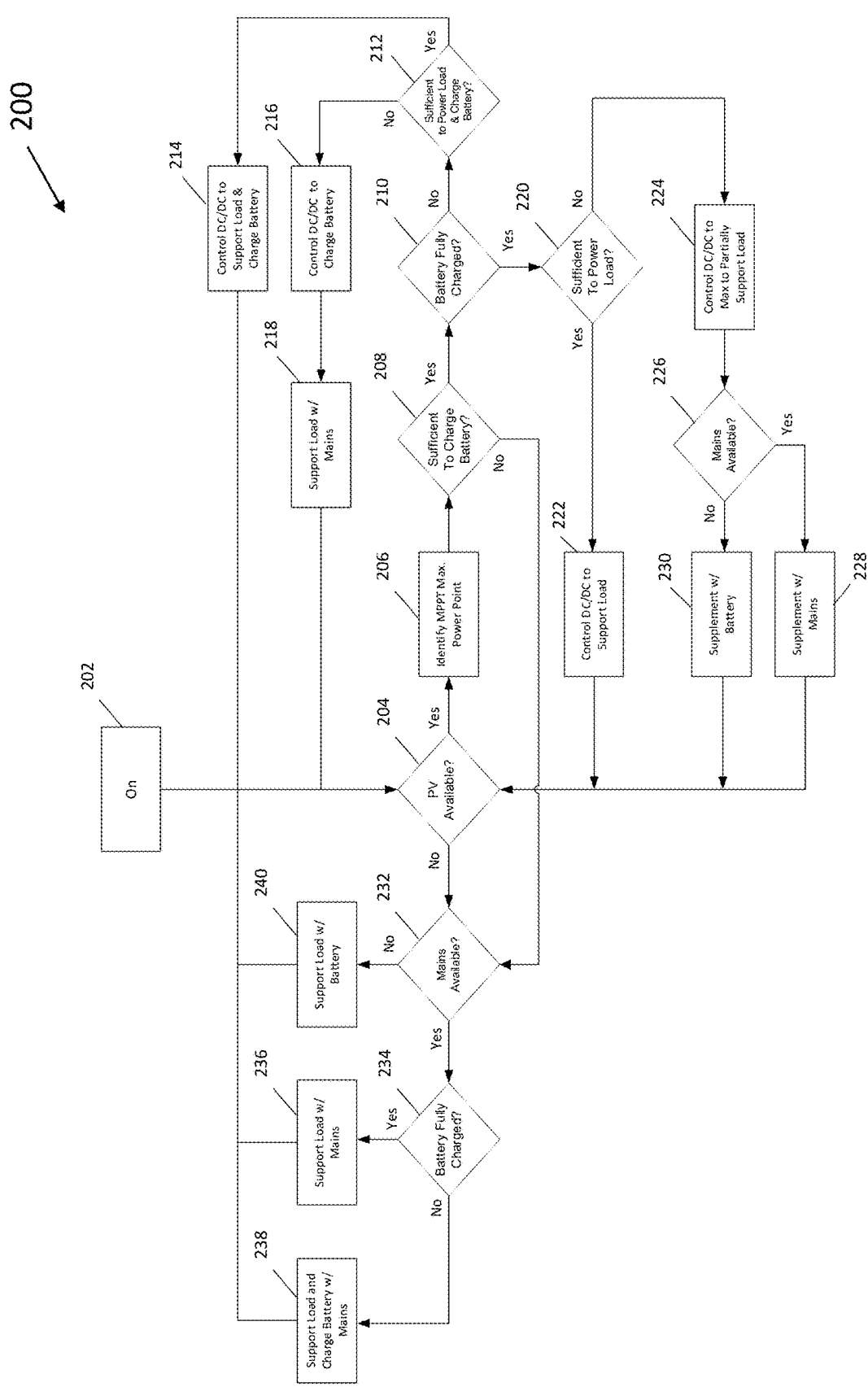
FIG. 2 is a flow chart illustrating a process for operating a UPS according to aspects described herein.

FIG. 2 is a flow chart illustrating operation of the power supply system 100 according to one aspect of the present invention. At block 202, the UPS 101 is turned on. At block 204, a determination is made by the controller 128 whether the renewable power source 123 is available. In one example, the controller 128 may receive a communication from the MPPT charge controller 124 indicating the availability of the renewable power source 123. In some examples, the availability of the renewable power source 123 (e.g., a photovoltaic array) can vary based on environmental conditions such as ambient temperature and weather conditions.

At block 206, in response to a determination that the renewable power source 123 is available, the controller 128 may further communicate with the MPPT charge controller 124 to identify the maximum power point of the renewable power source 123. The MPPT charge controller 124 tracks the maximum power point of the renewable power source 123 (i.e. the maximum level of power capable of being provided by the renewable power source 123 in view of current environmental conditions) and provides the maximum power point information to the controller. Once the controller 128 receives the maximum power point information from the MPPT charge controller 124, the controller may reference a duty-cycle look up table with respect to the maximum power point information. In referencing the duty-cycle look up table with respect to the maximum point information, the controller 128 may identify an appropriate duty-cycle at which the DC-DC converter 120 should be operated to draw the maximum possible power from the MPPT charge controller 124 (i.e., from the renewable power source 123).

At block 208, the controller 128 may determine if the maximum power point of the renewable power source 123 is sufficient to charge the battery 115. In one example, the maximum power point of the renewable power source 123 may be sufficient to charge the battery 115 if the maximum power point indicates that the renewable power source 123 can supply a current greater than or equal to a minimum charging current threshold of the battery 115.

At block 210, in response to a determination that the maximum power point of the renewable power source 123 is sufficient to charge the battery 115, the controller 128 may determine whether the battery 115 is fully charged. In some examples, fully charged may correspond to a maximum capacity of the battery 115; however, in other examples fully charged may correspond to a charge level greater than or equal to a charge level threshold (e.g., 95%).

At block 212, in response to a determination that the battery is not fully charged, the controller 128 may compare the received maximum power point information of the renewable power source 123 to a power level (i.e., threshold) necessary to simultaneously charge the battery 115 and power the load coupled to the output 110. In response to a determination that the maximum power point of the renewable power source 123 is greater than or equal to a level sufficient to charge the battery 115 and power the load, the controller 128 may operate the UPS 101 in the renewable mode of operation to charge the battery 115 and power the load using DC power drawn from the MPPT charge controller 124.

In one example, the controller 128 operates the DC-DC converter 120 to draw the maximum power from the MPPT charge controller 124 and does not operate the converter 104 to provide power to the DC bus 106, as the entire load can be supported by the renewable power source 123 while simultaneously charging the battery 115 (block 214). Alternatively, in response to a determination that the maximum power point of the renewable power source 123 is less than a level sufficient to charge the battery 115 and power the load, the controller 128 may operate the UPS 101 in the hybrid-online mode of operation. In one example, the controller 128 operates the DC-DC converter 120 to draw the maximum power from the MPPT charge controller 124 (e.g., 60% duty cycle) to charge the battery 115 (block 216) and to power a portion of the load. The controller 128 operates the converter 104 to convert AC mains power into DC power to support the remaining portion of the load; i.e., to supplement the power drawn from the MPPT charge controller 124 (block 218).

At block 220, in response to a determination that the battery 115 is fully charged, the controller 128 may compare the received maximum power point information of the renewable power source 123 to a power level (i.e., threshold) necessary to power only the load. In response to a determination that the maximum power point of the renewable power source 123 is greater than or equal to a level sufficient to power the load, the controller 128 may operate the UPS 101 in the renewable mode of operation. In one example of the renewable mode of operation, the controller 128 operates the DC-DC converter 120 to draw the maximum power from the MPPT charge controller 124 and does not operate the converter 104 to provide power to the DC bus 106, as the entire load can be supported by the renewable power source 123 (block 222).

Alternatively, in response to a determination that the maximum power point of the renewable power source 123 is less than a level sufficient to power the load, the controller 128 operates the UPS 101 in one of the hybrid modes of operation. In some examples, the controller 128 operates the DC-DC converter 120 to draw the maximum power from the MPPT charge controller 124 (e.g., 60% duty cycle) to power at least a portion of the load (block 224).

At block 226, the controller 128 may determine if AC mains power is acceptable (i.e., above an input power threshold). In response to a determination that AC mains power is acceptable, the controller 128 may operate the UPS 101 in the hybrid-online mode of operation. In one example, the controller 128 operates the converter 104 to convert AC mains power into DC power to supplement the power provided by the renewable power source 123 to the load (block 228).

Alternatively, in response to a determination that the AC mains power is unacceptable (i.e., below an input power threshold), the controller 128 may operate the UPS 101 in the hybrid-backup mode of operation. In one example, the controller 128 operates the DC-DC converter 120 to draw power from the battery 115 to supplement the power provided by the renewable power source 123 to the load (block 230). In some examples, the controller 128 monitors the DC bus 106 and operates the DC-DC converter 120 and converter 104 to ensure that sufficient DC power is provided to the DC bus 106. In this way, the power necessary to power the load is derived from the renewable power source 123 and AC mains or the battery 115 during the hybrid modes of operation.

Returning to block 208, in response to a determination that the maximum power point of the renewable power source 123 is less than a level sufficient to charge the battery 115, the controller 128 may determine the availability of AC mains power (block 232). In response to a determination that the AC mains power is acceptable, the controller 128 operates the UPS 101 in the online mode of operation. At block 234, the controller 128 may determine if the battery 115 is fully charged. In response to a determination that the battery 115 is fully charged, the controller 128 operates the converter 104 to convert AC mains power into DC power to power the load (block 236). In response to a determination that the battery 115 is not fully charged, the controller 128 operates the converter 104 to convert AC mains power into DC power to power the load and operates the DC-DC converter 120 to charge the battery 115 (block 238). In one example, the controller 128 may operate the converter 104 to provide DC power directly to the DC-DC converter 120 to charge the battery 115 while simultaneously providing DC power to the DC bus 106 to support the load. In other examples, the controller 128 may operate the DC-DC converter 120 to draw DC power from the DC bus 106 to charge the battery 115. Alternatively, in response to a determination that AC mains power is unacceptable, the controller 128 operates the UPS in the backup mode of operation. At block 240, the controller 128 operates the DC-DC converter 120 to provide DC power from the battery 115 to the DC bus 106 to power the load. While in the backup mode of operation, the controller 128 continues to monitor the input AC power provided to the mains input 102 and determine whether the AC power provided to the mains input 102 is acceptable.

As discussed above, the controller 128 is configured to monitor and control operation of the UPS 101. Using data stored in associated memory, the controller 128 is operable to execute one or more instructions that may result in the manipulation of one or more switches' conductive states. In some examples, the controller 128 can include one or more processors or other types of controllers. The controller 128 may perform a portion of the functions discussed herein on a processor, and perform another portion using an Application-Specific Integrated Circuit (ASIC) tailored to perform particular operations. Examples in accordance with the present invention may perform the operations described herein using many specific combinations of hardware and software and the invention is not limited to any particular combination of hardware and software components.

As described above, a UPS system is provided herein that optimizes throughput from a renewable power source to the UPS to avoid depletion of the UPS battery and improve availability of the UPS during grid downtime. When the renewable power source is available, the UPS efficiently operates to draw maximum possible power from the renewable power source. If the maximum power is insufficient to charge a battery coupled to the UPS, the UPS can operate in a hybrid-online mode of operation to supplement the power from the renewable power source with power from AC mains.

According to at least one embodiment, the UPS system can similarly be operated in a hybrid-backup mode of operation to draw maximum power from a renewable power source and to supplement the power from the renewable power source with DC power drawn from a battery, if necessary, to power a load coupled to the UPS system. For example, when mains power is unavailable, the UPS can operate to draw maximum possible power from the renewable power source. If the maximum power is insufficient to power the load coupled to the UPS, the UPS can operate to supplement the power from the renewable power source with power drawn from a battery.

According to at least one embodiment, the UPS system operates a majority of the time in the renewable or hybrid modes of operation described above where output power of the UPS system is mainly derived from the renewable power source and is supplemented with power from mains and/or a battery. However, in other embodiments, the UPS system may be operated differently.

Having thus described several aspects of at least one embodiment of this invention, it is to be appreciated various alterations, modifications, and improvements will readily occur to those skilled in the art. Such alterations, modifications, and improvements are intended to be part of this disclosure and are intended to be within the spirit and scope of the invention. Accordingly, the foregoing description and drawings are by way of example only.

What is claimed is:

1. An Uninterruptible Power Supply (UPS) system, the UPS system comprising:
   an input configured to be coupled to an AC source and to receive input AC power from the AC source;
   an output configured to provide output AC power to a load;
   a converter coupled to the input and configured to convert the input AC power into DC power;
   a DC bus coupled to the converter and configured to receive DC power from the converter;
   an inverter coupled to the DC bus and configured to convert DC power from the DC bus into the output AC power and provide the output AC power to the output;
   a Maximum Power Point Tracking (MPPT) controller configured to be coupled to a power source, to receive DC power from the power source, and to identify a maximum power point of the power source;
   a DC-DC converter coupled to the MPPT controller and the DC bus and configured to regulate DC power provided from the MPPT controller to the DC bus; and
   a controller coupled to the MPPT controller and the DC-DC converter, the controller configured to monitor the maximum power point of the power source, determine whether the maximum power point is greater than or equal to at least one threshold level, and in response to determining that the maximum power point is greater than or equal to the at least one threshold level, operate the DC-DC converter to draw DC power from the MPPT controller at the maximum power point of the power source.

2. The UPS system of claim 1, wherein in operating the DC-DC converter to draw DC power from the MPPT controller at the maximum power point of the power source, the controller is further configured to reference a look-up table with respect to the maximum power point to identify a corresponding duty-cycle and to operate the DC-DC converter at the corresponding duty-cycle.

3. The UPS system of claim 2, wherein in operating the DC-DC converter to draw DC power from the MPPT controller at the maximum power point of the power source, the controller is further configured to operate the DC-DC converter such that substantially all of the power drawn from the MPPT controller is provided to the DC bus.

4. The UPS system of claim 3, wherein the controller is further configured to operate the DC-DC converter to provide DC power, derived from the backup DC power, to the DC bus.

5. The UPS system of claim 4, wherein the controller is further configured to operate the DC-DC converter to provide DC power to the DC bus in response to a determination that the input AC power is not acceptable while the maximum power point is less than a first threshold indicating the DC power drawn from the MPPT controller is not sufficient to charge the battery.

6. The UPS system of claim 5, wherein the controller is further configured to operate the DC-DC converter to provide DC power to the DC bus in response to a determination that the input AC power is unacceptable and the battery is fully charged while the maximum power point is greater than or equal to the first threshold and less than a second threshold indicating the DC power drawn from the MPPT controller is not sufficient to power the load.

7. The UPS system of claim 1, wherein the controller is further configured to operate the converter to provide DC power to the DC bus while the maximum power point is less than a first threshold indicating the DC power drawn from the MPPT controller is not sufficient to charge the battery.

8. The UPS system of claim 7, wherein the controller is further configured to operate the converter to provide DC power to the DC bus in response to a determination that the battery is fully charged while the maximum power point is greater than the first threshold and less than a second threshold indicating the DC power drawn from the MPPT controller is not sufficient to power the load.

9. The UPS system of claim 8, wherein the controller is further configured to operate the converter to provide DC power to the DC bus in response to a determination that the battery is at least partially uncharged while the maximum power point is greater than the first threshold and less than a third threshold indicating the DC power drawn from the MPPT controller is not sufficient to charge the battery and power the load.

10. A non-transitory computer readable medium storing thereon sequences of computer-executable instructions for operating a UPS having an input configured to be coupled to an AC source, an output configured to provide output AC power to a load, a converter coupled to the input, a DC bus coupled to the converter, and an inverter coupled to the DC bus, the sequences of computer-executable instructions including instructions that instruct at least one processor to operate the UPS to:
   receive DC power from a power source;
   receive a maximum power point of the power source;
   regulate power provided from the power source to the DC bus;
   determine whether the maximum power point of the power source is greater than at least one threshold level;
   draw DC power from the power source at the maximum power point of the power source in response to a determination that the maximum power point of the power source is greater than or equal to the at least one threshold level; and
   convert DC power from the DC bus into the output AC power.

11. The non-transitory computer readable medium according to claim 10, wherein the UPS further has a DC-DC converter, and wherein the sequences of instructions include instructions that cause the at least one processor to operate the UPS to:

draw the DC power from the power source at the maximum power point of the power source by referencing a look-up table with respect to the maximum power point to identify a corresponding duty-cycle and operating the DC-DC converter at the corresponding duty-cycle.

12. The non-transitory computer readable medium according to claim 11, wherein the sequences of instructions include instructions that cause the at least one processor to operate the UPS to:
draw DC power from the power source at the maximum power point of the power source to provide substantially all of the power drawn from the power source to the DC bus.

13. The non-transitory computer readable medium according to claim 10, wherein the UPS further has a battery interface coupled to the DC-DC converter and configured to be coupled to a battery and to receive backup DC power from the battery and the sequences of instructions include instructions that cause the at least one processor to operate the UPS to:
provide, with the converter, DC power to the DC bus while the maximum power point is less than a first threshold indicating the DC power drawn from the power source is not sufficient to charge the battery.

14. The non-transitory computer readable medium according to claim 13, wherein the sequences of instructions include instructions that cause the at least one processor to operate the UPS to:
provide, with the converter, DC power to the DC bus in response to a determination that the battery is fully charged while the maximum power point is greater than the first threshold and less than a second threshold indicating the DC power drawn from the power source is not sufficient to power the load.

15. The non-transitory computer readable medium according to claim 14, wherein the sequences of instructions include instructions that cause the at least one processor to operate the UPS to:
provide, with the converter, DC power to the DC bus in response to a determination that the battery is at least partially uncharged while the maximum power point is greater than the first threshold and less than a third threshold indicating the DC power drawn from the power source is not sufficient to charge the battery and power the load.

16. The non-transitory computer readable medium according to claim 13, wherein the sequences of instructions include instructions that cause the at least one processor to operate the UPS to:
provide, with the DC-DC converter, DC power to the DC bus in response to a determination that the input AC power is not acceptable while the maximum power point is less than a first threshold indicating the DC power drawn from the power source is not sufficient to charge the battery.

17. The non-transitory computer readable medium according to claim 16, wherein the sequences of instructions include instructions that cause the at least one processor to operate the UPS to:
provide, with the DC-DC converter, DC power to the DC bus in response to a determination that the input AC power is unacceptable and the battery is fully charged while the maximum power point is greater than or equal to the first threshold and less than a second threshold indicating the DC power drawn from the power source is not sufficient to power the load.

18. An Uninterruptible Power Supply (UPS) system, the UPS system comprising:
an input configured to be coupled to an AC source and to receive input AC power from the AC source;
an output configured to provide output AC power to a load;
a converter coupled to the input and configured to convert the input AC power into DC power;
a DC bus coupled to the converter and configured to receive DC power from the converter;
an inverter coupled to the DC bus and configured to convert DC power from the DC bus into the output AC power and provide the output AC power to the output; and
means for identifying a maximum power point of a power source coupled to the UPS system, for drawing DC power from the power source at the maximum power point, and for providing the DC power drawn from the power source at the maximum power point to the DC bus.

19. The UPS of claim 18, further comprising means for providing power, derived from the input AC power, to the DC bus to supplement the DC power drawn from the power source at the maximum power point.

20. The UPS of claim 18, further comprising means for providing backup DC power from a battery to the DC bus.

* * * * *